(12) United States Patent
Lo et al.

(10) Patent No.: US 8,283,780 B2
(45) Date of Patent: Oct. 9, 2012

(54) SURFACE MOUNT SEMICONDUCTOR DEVICE

(75) Inventors: Wai Yew Lo, Petaling Jaya (MY); Ly Hoon Khoo, Port Klang (MY); Wen Shi Koh, Petaling Jaya (MY)

(73) Assignee: Freescale Semiconductor, Inc, Austin, TX (US)

( * ) Notice: Subject to any disclaimer, the term of this patent is extended or adjusted under 35 U.S.C. 154(b) by 48 days.

(21) Appl. No.: 12/954,630

(22) Filed: Nov. 25, 2010

(65) Prior Publication Data

US 2012/0133053 A1    May 31, 2012

(51) Int. Cl.
*H01L 23/48*    (2006.01)
(52) U.S. Cl. . 257/737; 257/778; 257/784; 257/E23.023; 257/E23.024
(58) Field of Classification Search .......... 257/737, 257/777, 778, 794, E23.023, E23.024
See application file for complete search history.

(56) References Cited

U.S. PATENT DOCUMENTS

| | | | |
|---|---|---|---|
| 3,626,086 A | 12/1971 | Rubey | |
| 6,153,940 A * | 11/2000 | Zakel et al. | 257/779 |
| 6,181,569 B1 * | 1/2001 | Chakravorty | 361/761 |
| 6,617,193 B1 * | 9/2003 | Toshio et al. | 438/106 |
| 6,854,637 B2 | 2/2005 | Harun | |
| 7,138,328 B2 | 11/2006 | Downey | |
| 2005/0104196 A1 * | 5/2005 | Kashiwazaki | 257/706 |

* cited by examiner

*Primary Examiner* — Robert Huber
(74) *Attorney, Agent, or Firm* — Charles Bergere (57) ABSTRACT

A surface mount semiconductor device has a semiconductor die encapsulated in a molding compound. Electrical contact elements of an intermediate set are disposed on the molding compound. A set of coated wires electrically connect bonding pads of the semiconductor die and the electrical contact elements of the intermediate set. A layer of insulating material covers the coated wires, the die and the electrical contact elements of the intermediate set. Electrically conductive elements are exposed at an external surface of the layer of insulating material and contact respective electrical contact elements of the intermediate set through the layer of insulating material.

7 Claims, 6 Drawing Sheets

SURFACE MOUNT SEMICONDUCTOR DEVICE

BACKGROUND OF THE INVENTION

The present invention is directed to a surface mount semiconductor device and to a method of assembling a surface mount semiconductor device.

Semiconductor device packaging fulfills basic functions such as providing electrical connections and protecting the die against mechanical and environmental stresses. Continued progress in reduction of the size of the semiconductor dies and increased functionality and complexity of the circuits integrated in the dies require size reduction of the packaging with the same or greater complexity of the electrical connections with external circuits.

Semiconductor devices are commonly packaged for surface mounting by encapsulating one or more semiconductor dies with a mold compound. Electrical contacts for connection with external circuits are exposed in an active face of the package and are connected internally with electrical contact pads on the semiconductor die. Various techniques are available for connecting the exposed electrical contacts of the package internally with the embedded semiconductor die.

In a wire bonded package, the semiconductor die may be mounted on a substrate with the bond pads of the semiconductor die on the active face of the die opposite from the substrate. Wires are then bonded to the die bond pads and to the exposed electrical contacts of the package to provide the internal connections. The substrate may be an electrically conductive lead frame, whose frame members are cut off and discarded during production after applying molding compound to encapsulate the semiconductor die, the internal connections and the exposed electrical contacts from the lead frame. This technique is limited to devices where the exposed electrical contacts of the package are disposed around the periphery of the semiconductor die.

In an example of a flip-chip technique, the contact pads of the semiconductor die (or 'chip') on its active face are metallized and solder balls or studs are applied to the contact pads, typically before singulation of the dies from the wafer. The singulated dies are then placed with their active face on external circuits or on a printed circuit board substrate bearing an array of corresponding external contacts. The solder is then re-melted, typically using an ultrasonic or alternatively a reflow solder process to establish the electrical connections. This technique requires the same identical geometry for the array of external contacts as for the array of contact pads on the semiconductor die. Accordingly, the distribution of connections between the external contacts and the semiconductor die is imposed and any redistribution has to be provided by the external circuits. If the package contains more than one die, any interconnection between the dies has to be provided by the external circuits. Moreover, a minimum spacing of the solder balls or studs is required to avoid risk of short circuits.

In a technique known as 'redistributed chip packaging', singulated dies are placed temporarily with their active face on a substrate. The dies are embedded with a molding compound into a panel and then released from the substrate. The pads on the die surfaces are then connected to exposed pads on the surface of the package panel by a redistribution process to route out the signal connections, and the power and ground connections. The redistribution process comprises deposition of a plurality of electrically conductive layers by electroplating techniques, separated by insulating layers and patterned using batch process lithography. However, the process requires deposition and patterning of several layers, requiring precision aligning and several extra process steps, especially for complex redistribution.

BRIEF DESCRIPTION OF THE DRAWINGS

The present invention is illustrated by way of example and is not limited by embodiments thereof shown in the accompanying Figs, in which like references indicate similar elements. Elements in the Figs. are illustrated for simplicity and clarity and have not necessarily been drawn to scale.

DETAILED DESCRIPTION OF PREFERRED EMBODIMENTS

Figure 1:
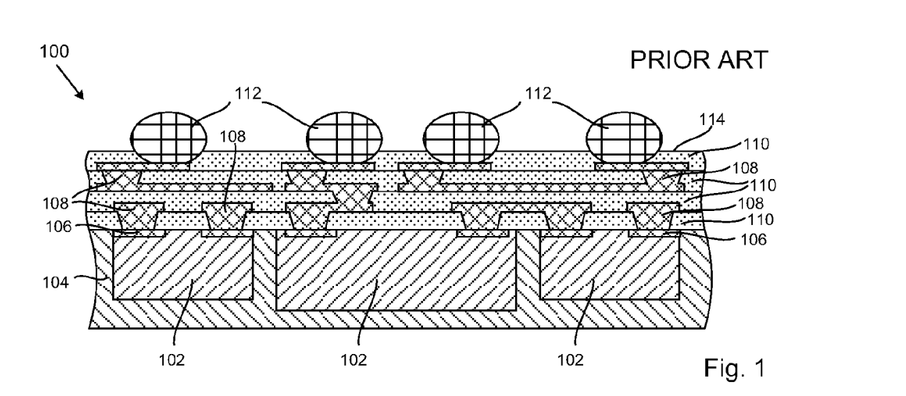
FIG. 1 is a schematic detailed section along the line 1-1 of FIG. 2 of a known redistributed chip package semiconductor device.
Figure 2:
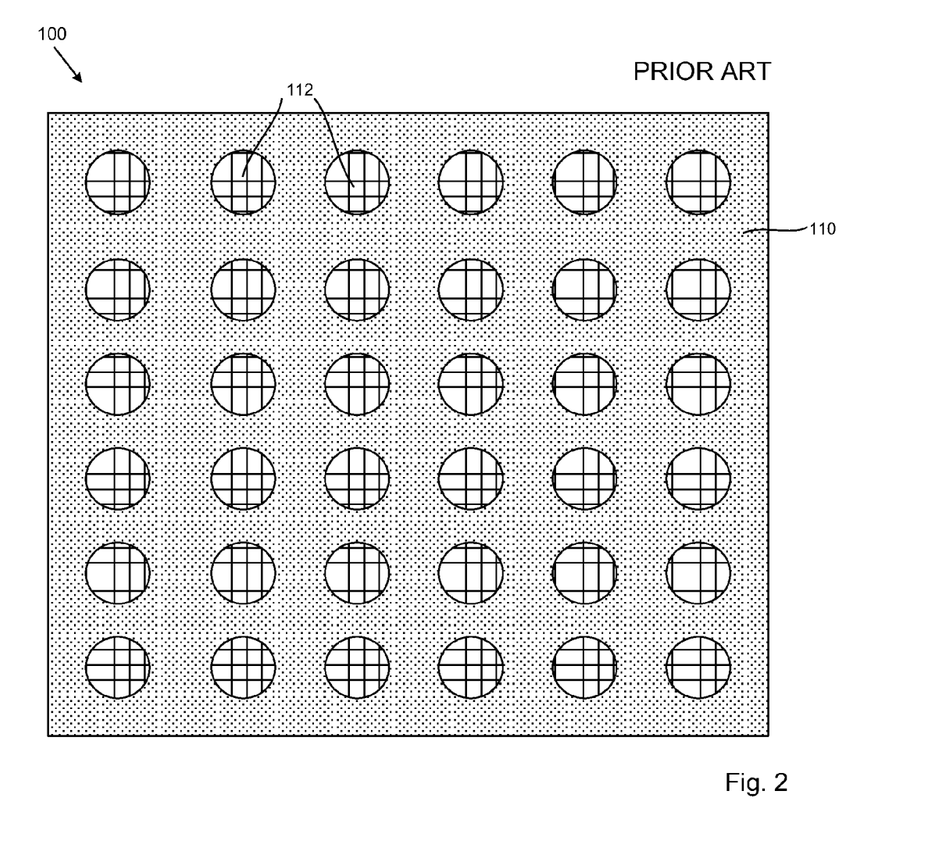
FIG. 2 is a schematic plan view of the active face of the known redistributed chip package semiconductor device of FIG. 1.

FIGS. 1 and 2 show a known redistributed chip package ('RCP') semiconductor device 100. The semiconductor device 100 includes one or more (in this case three) singulated semiconductor dies 102 embedded in a molding compound 104 with electrical contact pads such as 106 at a surface of the molding compound. A plurality of electrically conductive layers and vias 108, separated by insulating layers 110, are formed on the surface of the molding compound and provide interconnections between the semiconductor dies 102 and with an array of solder balls 112 at an active face 114 of the device 100. Patterning of the electrically conductive layers and vias 108 enables the array or arrays of pads 106 on the semiconductor dies 102 to be redistributed geometrically, so that the array of solder balls 112 at the active face 114 of the device 100 may have a different geometry from the geometry of the pads 106 on the semiconductor dies 102.

During manufacture, the singulated semiconductor dies 102 are placed temporarily with their active face on a substrate. The dies are embedded with the molding compound 104 into a panel and then released from the substrate. The redistribution interconnections are then formed by alternately depositing the electrically conductive layers and vias 108 by electroplating techniques, and applying the insulating layers 110 to separate the different electrically conductive layers 108.

FIGS. 3 and 4, and FIGS. 16 and 17, show examples of surface mount semiconductor devices 300 and 1600 respectively in accordance with embodiments of the invention. The semiconductor devices 300 and 1600 each include a semiconductor die 302 having an active face 304 presenting a die set of electrical contact elements 306 and a further die face 308 opposite the active face 304. A molding compound 310 encapsulates the semiconductor die 302 with the further die face 308 embedded in the molding compound 310. Electrical contact elements 312 of an intermediate set are disposed on the molding compound 310. Electrical connections between respective electrical contact elements 306 of the die set and respective electrical contact elements 312 of the intermediate set are made through a set of coated or insulated wires 314. A layer 316 of insulating material encapsulates the coated wires 314, the electrical contact elements 306 of the die set and the electrical contact elements 312 of the intermediate set. Electrically conductive elements 318 of an exposed set are exposed at an external surface 320 of the layer 316 of insulating material and contact respective electrical contact elements 312 of the intermediate set through the layer 316 of insulating material.

Figure 4:
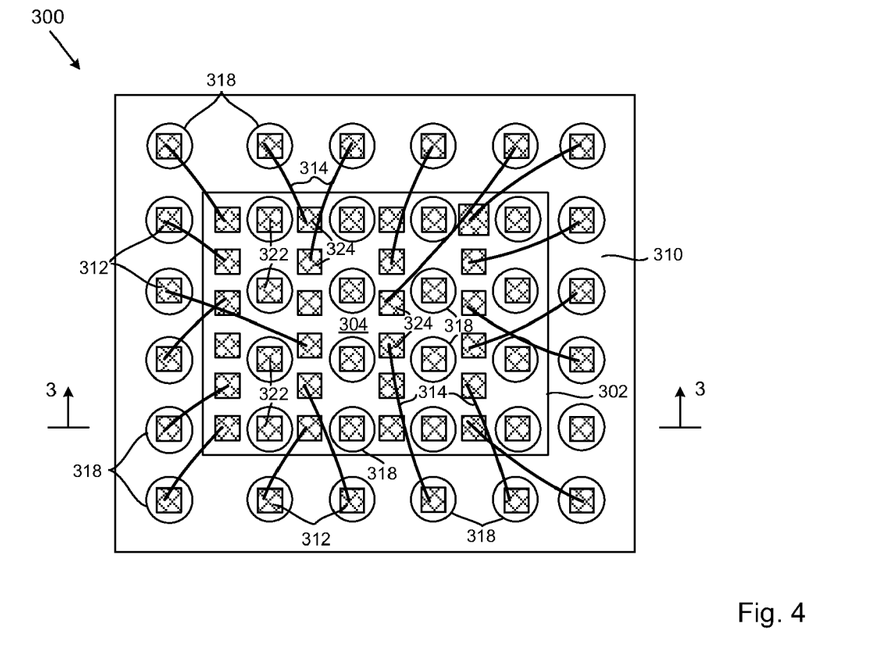
FIG. 4 is a schematic plan view, partly in section along the line 4-4 of FIG. 3, of the active face of the redistributed chip package semiconductor device of FIG. 3.
Figure 5:
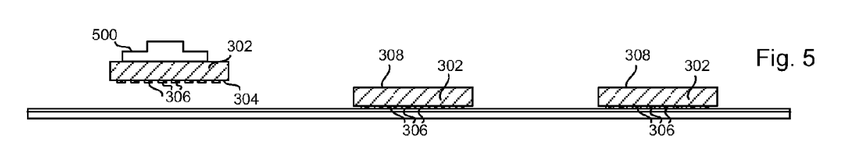
FIGS. 5 to 15 are similar sectional views of redistributed chip package semiconductor devices of the kind shown in FIGS. 3 and 4 at various stages during a method of manufacture in accordance with one embodiment of the invention.
Figure 17:
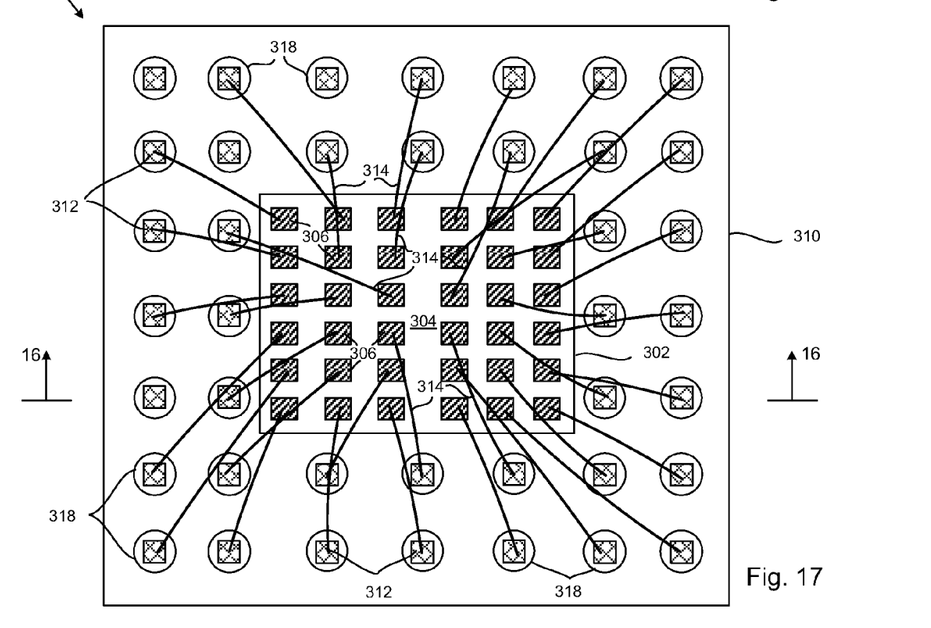
FIG. 17 is a schematic plan view, partly in section along the line 17-17 of FIG. 16, of the active face of the redistributed chip package semiconductor device of FIG. 16.

It will be appreciated that a semiconductor device such as 300 and 1600 may include more than one semiconductor die 302 having respective die sets of electrical contact elements 306 that may be interconnected and may be connected with the elements 318 of the exposed set by the set of wires 314 and the electrical contact elements 312 of the intermediate set. Although a single row of elements 318 of the exposed set is shown around the die 302, for simplicity, it will be appreciated that more than one row may be provided. In FIGS. 4 and 17, the layer 316 of insulating material is shown cut away and the positions of the electrically conductive elements 318 of the exposed set are shown to illustrate the layout.

The set of wires 314 enable redistributed connection between the electrical contact elements 306 of the die set and the electrically conductive elements 318 of the exposed set. The resulting package is thin, is less complex than the device of FIGS. 1 and 2 and is less costly to manufacture.

Various electrically insulating materials may be used for the molding compound. The layer 316 is applied after embedding the semiconductor die 302 and making the electrical connections with the coated wires 314 and the layer 316 may be of a different electrically insulating material from the molding compound 310. In the devices 300 and 1600, the paths of the wires 314 may cross each other and the electrical insulation coatings of two wires may touch without forming short circuits between the wires. Even in use of the finished device, movement or vibration of the device will not cause short circuits, since the layer 316 of insulating material encapsulating the coated wires 314 protects them.

The material of the wires 314 may be gold, although other materials are available. The material of the layer 316 of insulating material encapsulating the coated wires 314 may be a photoresist patterned to accommodate the electrical contact elements 312 of the intermediate set and the electrically conductive elements 318 of the exposed set. In use of the finished surface mount device, its active face and the photoresist layer 316 will normally be protected by the external circuits on which the device is mounted, especially if an underfill is injected between the active face of the device and the surface of the external circuits.

Figure 3:
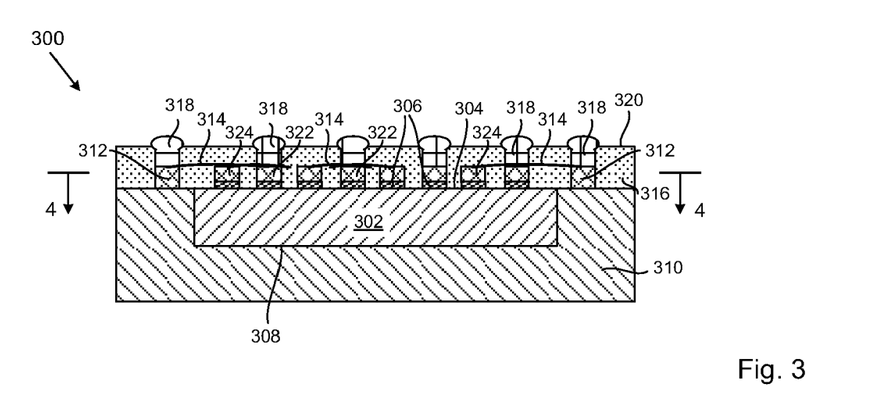
FIG. 3 is a schematic detailed section along the line 3-3 of FIG. 4 of a redistributed chip package semiconductor device in accordance with one embodiment of the invention.

In the device 300 of FIGS. 3 and 4, further intermediate electrical contact elements 322 are disposed on some of the electrical contact elements 306 of the die set, and electrically conductive elements 318 of the exposed set also contact directly the further intermediate electrical contact elements 322, without wires such as 314, through the layer 316 of insulating material in order to connect with the respective electrical contact elements 306 of the die set. In the device 1600 of FIGS. 16 and 17, the electrically conductive elements 318 of the exposed set are all disposed peripherally round the die 302 and are connected with the respective electrical contact elements 306 of the die set through wires such as 314.

In the device 300 of FIGS. 3 and 4, the set of wires 314 coated with electrical insulation make electrical connections with the respective electrical contact elements 306 of the die set through further intermediate electrical contact elements 324 disposed on the respective electrical contact elements 306 of the die set. In the device 1600 of FIGS. 16 and 17, the set of wires 314 coated with electrical insulation make electrical connections with the respective electrical contact elements 306 of the die set directly.

Figure 16:
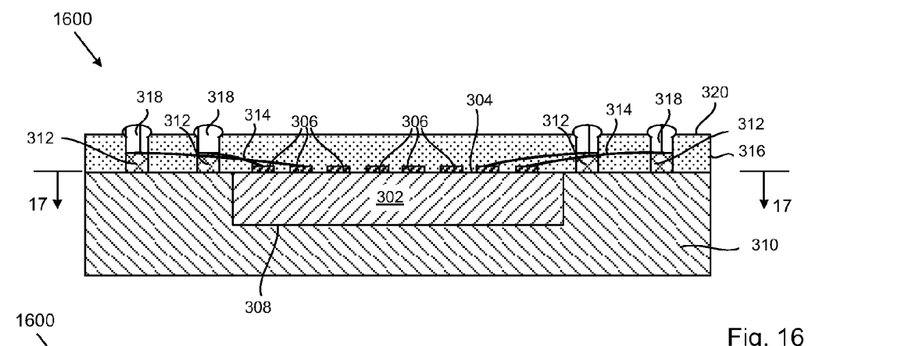
FIG. 16 is a schematic detailed section along the line 16-16 of FIG. 17 of a redistributed chip package semiconductor device in accordance with another embodiment of the invention.

The electrically conductive elements 318 of the exposed set and electrical contact elements 306 of the die set to which they are connected are disposed in arrays having different geometries. In particular, in the device 300, as shown in FIGS. 3 and 4, the shape and disposition of the electrically conductive elements 318 is similar to the array of the die set of electrical contact elements 306 but the pitch and spacing of the electrically conductive elements 318 is greater, enabling the use of bigger elements 318 without needing to increase the size of the die set of electrical contact elements 306 and the die 302 itself. In the device 1600, as shown in FIGS. 16 and 17, the electrically conductive elements 318 of the exposed set are all disposed peripherally round the die 302 whereas the die set of electrical contact elements 306 are disposed in a grid array on the die 302 itself with smaller pitch and spacing than the electrically conductive elements 318 of the exposed set.

In the devices 300 and 1600, the electrically conductive elements 318 of the exposed set are formed of solder. When the finished device is mounted on an external circuit, the solder elements 318 are placed on matching pads of the external circuit and the solder is then re-melted to make the electrical connections with the external circuit. However, it is also possible to provide solder elements, such as solder paste, on the pads of the external circuit instead of on the semiconductor device itself.

FIGS. 5 to 15 and 18 to 24 show examples of methods of making a surface mount semiconductor device in accordance with embodiments of the invention. The methods are illustrated and described as applied to making the devices 300 and 1600 respectively, but it will be appreciated that the methods are applicable to other devices. The methods illustrated comprise providing a semiconductor die 302 having an active face 304 presenting a die set of electrical contact elements 306 and a further die face 308 opposite the active face 304. The semiconductor die 302 is encapsulated in a molding compound 310 with the further die face 308 embedded in the molding compound. An intermediate set of electrical contact elements 312 is provided on the molding compound 310. Electrical connections are made between respective electrical contact elements 306 of the die set and respective electrical contact elements 312 of the intermediate set through a set of wires 314 coated with electrical insulation. A layer 316 of insulating material is formed encapsulating the coated wires 314 and the electrical contact elements 306 of the die set and the electrical contact elements 312 of the intermediate set. Electrically conductive elements 318 of an exposed set are provided, which are exposed at an external surface 320 of the layer of insulating material, and which contact respective electrical contact elements 312 of the intermediate set through the layer 316 of insulating material.

Figure 6:
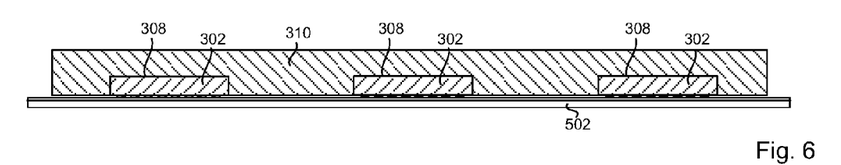

In more detail, in the method of FIGS. 5 to 15, a one-dimensional or two-dimensional array of the singulated semiconductor dies 302 are picked and placed by a tool shown schematically at 500. The dies 302 are placed temporarily with their active faces contacting, and supported by, a substrate 502 comprising an adhesive tape backed by a metal base. As shown in FIG. 6, the semiconductor dies 302 are then encapsulated in a molding compound 310 to form a panel, with the further die faces 308 embedded in the molding compound.

Figure 7:
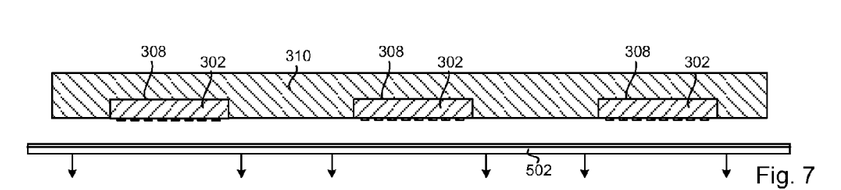
Figure 8:
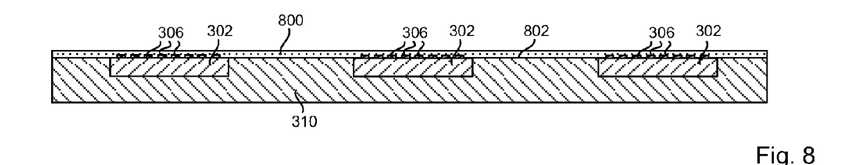
Figure 9:
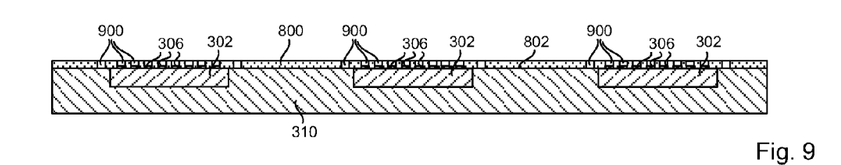

As shown in FIG. 7, the panel of semiconductor dies 302 embedded in the molding compound 310 is then detached from the substrate 502 and the substrate removed. A layer 800 of photoresist material is then applied over the surface 802 of the molding compound into which the dies 302 are embedded and over the active faces 304 of the dies 302, as shown in FIG. 8. The layer 800 may be applied by lamination, for example. Various photoresist materials are suitable, which are electrically insulating.

The layer 800 of photoresist material is then patterned by exposing the photoresist material through a mask to appropriate radiation, such as light of a suitable wavelength for example, and selectively dissolving the layer 800 of photoresist. Selectively dissolving the layer 800 of photoresist forms apertures 900 through the layer of photoresist, at the positions of the intermediate set of electrical contacts 312, 322 and 324.

Figure 10:
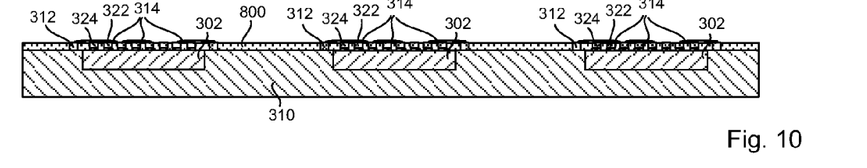

The intermediate set of electrical contact elements 312, 322 and 324 is then formed on the molding compound 310 and on the electrical contact elements 306 of the die set. The electrical contact elements 312, 322 and 324 are formed in this example by electroplating the electrically conductive material of the electrical contact elements 312, 322 and 324 through the layer 800 of insulating photoresist material. The material electroplated is suitable for subsequent wire bonding and may be copper and/or nickel/gold, for example. Electrical connections are made between respective electrical contact elements 306 of the die set and respective electrical contact elements 312 of the intermediate set through a set of wires 314 coated with electrical insulation, as shown in FIG. 10, the wires being bonded at one end to an electrical contact element 312 of the intermediate set and at the other end to an electrical contact element 322 of the intermediate set, itself in contact with the electrical contact element 306 of the die set. The electrical connections are made by wire bonding, such as thermosonic bonding, for example.

Figure 11:
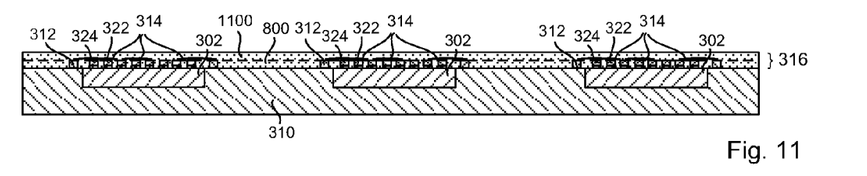

A further layer 1100 of photoresist material is then applied over the first photoresist layer 800, the electrical contact elements 312, 322 and 324 of the intermediate set and the set of coated wires 314 to form the encapsulating layer 316 of insulating material, as shown in FIG. 11. The layer 1100 may be applied by spraying, pressurized encapsulation or liquid imaging, for example.

Figure 12:
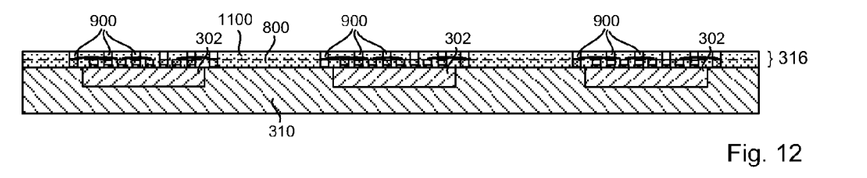

The layer 1100 of photoresist material is then patterned by exposing the photoresist material through a mask to appropriate radiation, such as light of a suitable wavelength for example, and selectively dissolving the layer 1100 of photoresist. Selectively dissolving the layer 800 of photoresist forms apertures 1200 through the layer of photoresist, at the positions of the electrically conductive elements 318 of the exposed set, as shown in FIG. 12.

Figure 13:
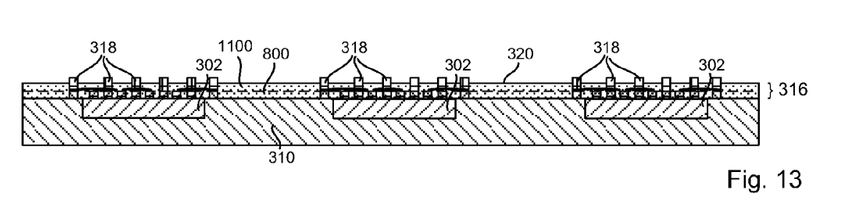
Figure 14:
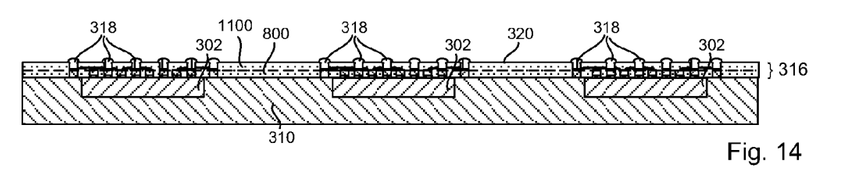

Electrically conductive material is then electroplated through apertures 1200 in the layer 1100 of insulating photoresist material to provide material for the exposed set of electrically conductive elements 318, as shown in FIG. 13. The material for the electrically conductive elements 318 contacts electrically the respective electrical contact elements 312 and 322 of the intermediate set and also contacts the wires 314 where they make electrical connections with the corresponding electrical contact elements 312 of the intermediate set. In the devices 300 and 1600, the electrically conductive elements 318 of the exposed set are formed of solder. After plating the solder through the apertures 1200, the panel is heated, for example by hot air, to reflow the solder and form solder balls as the contacts of the electrically conductive elements 318, as shown in FIG. 14. However, if the solder elements, such as solder paste, are provided on the pads of the external circuit instead of on the semiconductor device itself, the material of the electrically conductive elements 318 of the exposed set may be a material compatible with the solder of the external circuit, such as tin/lead, silver or gold plated copper, for example.

Figure 15:
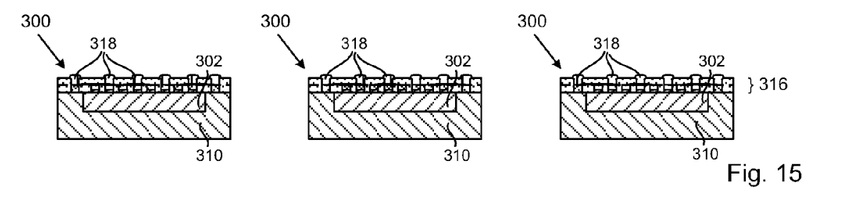

The semiconductor devices 300 are then singulated from the panel, by saw singulation, for example, as shown in FIG. 15.

Figure 18:
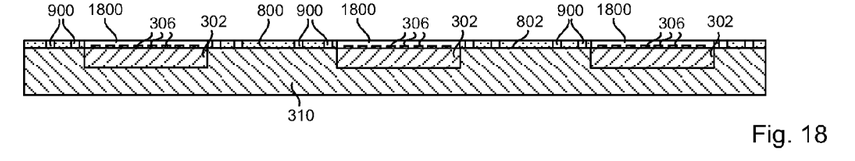
FIGS. 18 to 24 are similar sectional views of redistributed chip package semiconductor devices of the kind shown in FIGS. 16 and 17 at various stages during a method of manufacture in accordance with another embodiment of the invention.

The initial steps of the method of FIGS. 18 to 24 are identical to the steps illustrated in FIGS. 5 to 8. After applying the layer 800 of photoresist material is over the surface 802 of the molding compound into which the dies 302 are embedded and over the active faces 304 of the dies 302, as shown in FIG. 8, the layer 800 of photoresist material is then patterned to form not only the apertures 900 through the layer of photoresist, at the positions of the intermediate set of electrical contacts 312 but also an aperture 1800 exposing the active faces 304 of the dies 302, with the electrical contact elements 306, as shown in FIG. 18.

The intermediate set of electrical contact elements 312 is then formed on the molding compound 310 but not on the electrical contact elements 306 of the die set. The electrical contact elements 312 are formed in this example by electroplating the electrically conductive material of the electrical contact elements 312 through the apertures 900 in the layer 800 of insulating photoresist material.

Figure 19:
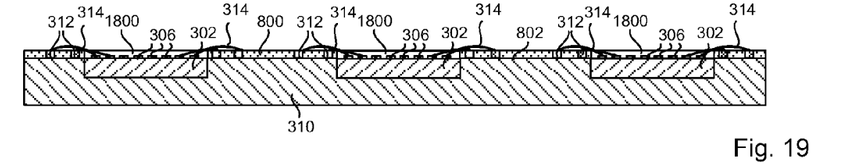

Electrical connections are then made directly between respective electrical contact elements 306 of the die set and respective electrical contact elements 312 of the intermediate set through a set of wires 314 coated with electrical insulation, as shown in FIG. 19. Again, the electrical connections are made by wire bonding, such as thermosonic bonding, for example.

Figure 20:
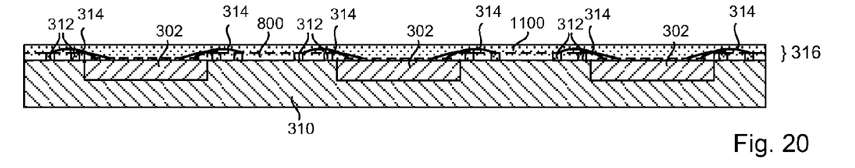
Figure 21:
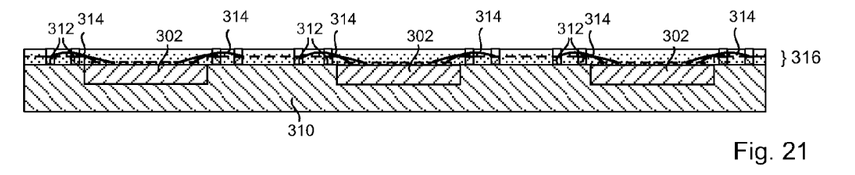

A further layer 1100 of photoresist material is then applied over the first photoresist layer 800, the electrical contact elements 312 of the intermediate set, the electrical contact elements 306 of the die set and the set of coated wires 314 to form the layer 316 of insulating material, as shown in FIG. 20. The layer 1100 may be applied by spraying, pressurized encapsulation or liquid imaging, for example.

Figure 22:
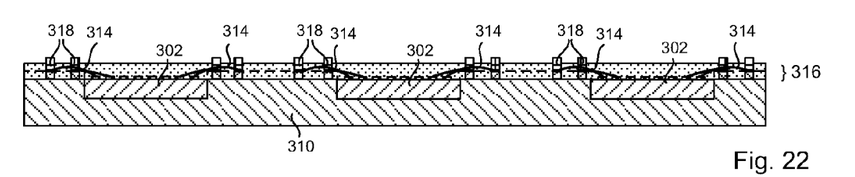
Figure 23:
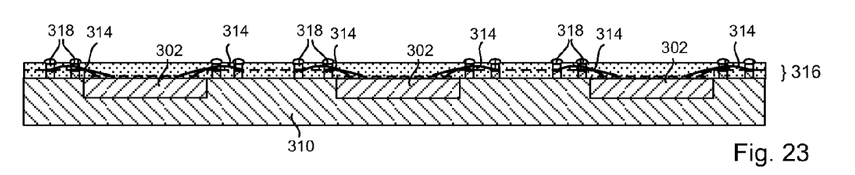
Figure 24:
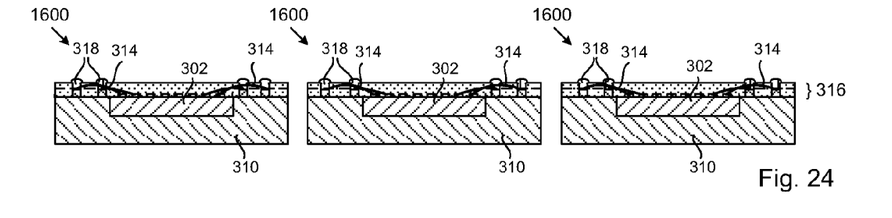

The steps of the method shown in FIGS. 20 to 24 are identical to the steps illustrated in FIGS. 11 to 15, except that the material for the exposed set of electrically conductive elements 318, as shown in FIGS. 22 and 23 is only provided in contact with the electrical contact elements 312 of the intermediate set and the corresponding wires 314.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, siliconon-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A surface mount semiconductor device, comprising:
a semiconductor die having an active face presenting a die set of electrical contact elements and a further die face opposite said active face;
a molding compound encapsulating said semiconductor die, wherein said further die face is embedded in said molding compound;
an intermediate set of intermediate electrical contact elements disposed on said molding compound;
electrical connections between respective electrical contact elements of said die set and respective electrical contact elements of said intermediate set through a set of coated wires;
a layer of insulating material encapsulating said coated wires and said electrical contact elements of said die set and of said intermediate set; and
electrically conductive elements of an exposed set, which are exposed at an external surface of said layer of insulating material and which contact respective electrical contact elements of said intermediate set through said layer of insulating material, and
wherein electrically conductive elements of said exposed set contacting respective electrical contact elements of said intermediate set also contact said set of coated wires making electrical connections with said respective electrical contact elements of said intermediate set.

2. The semiconductor device of claim 1, wherein said layer of insulating material comprises at least one layer of photoresist.

3. The semiconductor device of claim 1, wherein said intermediate set also includes further intermediate electrical contact elements disposed on respective electrical contact elements of said die set, and wherein electrically conductive elements of said exposed set also contact said further intermediate electrical contact elements through said layer of insulating material in order to connect with said respective electrical contact elements of said die set.

4. The semiconductor device of claim 1, wherein said intermediate set also includes further electrical contact elements disposed on respective electrical contact elements of said die set, and wherein said set of wires coated with electrical insulation make electrical connections with said respective electrical contact elements of said die set through said further intermediate electrical contact elements.

5. The semiconductor device of claim 1, wherein said set of wires coated with electrical insulation make electrical connections directly with said respective electrical contact elements of said die set.

6. The semiconductor device of claim 1, wherein said electrically conductive elements of said exposed set comprise electrical contact elements of solder.

7. The semiconductor device of claim 1, wherein electrically conductive elements of said exposed set and electrical contact elements of said die set to which they are connected are disposed in arrays having different geometries.

* * * * *